US012638782B2

(12) United States Patent
Cramer et al.

(10) Patent No.: US 12,638,782 B2
(45) Date of Patent: May 26, 2026

(54) METHOD OF DETERMINING A SAMPLING SCHEME, ASSOCIATED APPARATUS AND COMPUTER PROGRAM

(71) Applicant: ASML Netherlands B.V., Veldhoven (NL)

(72) Inventors: Hugo Augustinus Joseph Cramer, Eindhoven (NL); Patricius Aloysius Jacobus Tinnemans, Hapert (NL); Jeroen Arnoldus Leonardus Johannes Raaymakers, Oirschot (NL); Jochem Sebastiaan Wildenberg, Aarle-Rixtel (NL)

(73) Assignee: ASML Netherlands B.V., Veldhoven (NL)

( * ) Notice: Subject to any disclaimer, the term of this patent is extended or adjusted under 35 U.S.C. 154(b) by 891 days.

(21) Appl. No.: 17/916,746

(22) PCT Filed: Mar. 10, 2021

(86) PCT No.: PCT/EP2021/056081
§ 371 (c)(1),
(2) Date: Oct. 3, 2022

(87) PCT Pub. No.: WO2021/204487
PCT Pub. Date: Oct. 14, 2021

(65) Prior Publication Data
US 2023/0141495 A1 May 11, 2023

(30) Foreign Application Priority Data

Apr. 6, 2020 (EP) ..................................... 20168243
Apr. 9, 2020 (EP) ..................................... 20168876

(51) Int. Cl.
*G03F 7/00* (2006.01)

(52) U.S. Cl.
CPC ...... *G03F 7/70525* (2013.01); *G03F 7/70625* (2013.01); *G03F 7/70633* (2013.01)

(58) Field of Classification Search
CPC ............. G03F 7/70525; G03F 7/70616; G03F 7/70625; G03F 7/70633; G03F 9/7046;
(Continued)

(56) References Cited

U.S. PATENT DOCUMENTS 5,525,808 A * 6/1996 Irie ....................... G03F 9/7003
250/548
10,692,227 B2 6/2020 Riggs et al.
(Continued)

FOREIGN PATENT DOCUMENTS

CN 101636696 A 1/2010
CN 106200279 A 12/2016
(Continued)

OTHER PUBLICATIONS

International Search Report and Written Opinion of the International Searching Authority directed to related International Patent Application No. PCT/EP2021/056081, mailed May 28, 2021; 9 pages.
(Continued)

*Primary Examiner* — Deoram Persaud
(74) *Attorney, Agent, or Firm* — FINNEGAN, HENDERSON, FARABOW, GARRETT & DUNNER LLP

(57) ABSTRACT

Disclosed is a method of determining a sampling scheme. The method comprises obtaining a parallel sensor description and identifying a plurality of candidate acquisition configurations based on said parallel sensor description and potential metrology locations. Each of said candidate acquisition configurations is evaluated in terms of an evaluation metric and a candidate acquisition configuration is selected
(Continued)

based on said evaluation. The corresponding metrology locations for the selected acquisition configuration is added to the sampling scheme.

15 Claims, 5 Drawing Sheets

(58) Field of Classification Search
CPC ... G02B 5/208; G02B 5/283; G02F 1/133322; G02F 1/133331; G02F 1/133385; G02F 1/1339; H05K 7/20972; H05K 7/2099
See application file for complete search history.

(56) References Cited

U.S. PATENT DOCUMENTS

| | | | | |
|---|---|---|---|---|
| 10,859,930 | B2 * | 12/2020 | Menger ................. | G03F 9/7046 |
| 2004/0212801 | A1 | 10/2004 | Wu et al. | |
| 2016/0334717 | A1 | 11/2016 | Wildenberg et al. | |
| 2017/0097574 | A1 | 4/2017 | Goodwin et al. | |
| 2018/0307135 | A1 * | 10/2018 | Ten Berge ................ | G03F 1/72 |

| | | | | |
|---|---|---|---|---|
| 2018/0314149 | A1 * | 11/2018 | Mulkens ............... | G03F 7/7065 |
| 2018/0314168 | A1 * | 11/2018 | Van Haren .......... | G03F 7/70641 |
| 2018/0322237 | A1 * | 11/2018 | Ten Berge ................ | G03F 1/70 |
| 2024/0004313 | A1 * | 1/2024 | Verschuren .......... | G01B 11/272 |
| 2024/0241452 | A1 * | 7/2024 | Beukman .............. | G03F 9/7088 |

FOREIGN PATENT DOCUMENTS

| | | | |
|---|---|---|---|
| CN | 107532945 | A | 1/2018 |
| CN | 109863458 | A | 6/2019 |
| CN | 110657953 | A | 1/2020 |
| EP | 3 611 567 | A2 | 2/2020 |
| TW | 2018-39875 | A | 11/2018 |
| WO | WO 2015/110191 | A1 | 7/2015 |
| WO | WO 2019/238363 | A1 | 12/2019 |

OTHER PUBLICATIONS

Huang et al., "Overlay Improvement by Zone Alignment Strategy," Proc. of SPIE vol. 6922, Metrology, Inspection, and Process Control for Microlithography XXII, Apr. 2008; pp. 1-8.

* cited by examiner

METHOD OF DETERMINING A SAMPLING SCHEME, ASSOCIATED APPARATUS AND COMPUTER PROGRAM

CROSS REFERENCE TO RELATED APPLICATIONS

This application claims priority of EP application 20168243.2 which was filed on Apr. 6, 2020 and EP application 20168876.9 which was filed on Apr. 9, 2020 which is incorporated herein in its entirety by reference.

FIELD

The present invention relates to a method of determining a sampling scheme for metrology, an associated apparatus and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor or other products.

As pattern features become smaller and overlay performance requirements become ever more demanding, so-called advanced alignment models have been and continue to be developed to model and correct more accurately non-linear distortions of the wafer 'grid'. These advanced models depend on measuring an increased number of targets across the wafer. Ultimately, however only a limited number of the available targets can be measured without unduly limiting the throughput and/or costs of the lithographic process as a whole.

SUMMARY

It is desirable therefore to increase the informativity, coverage and/or throughput of a metrology process in an economically effective way.

In one aspect, the invention provides a method of determining a sampling scheme, the sampling scheme describing a proper subset of metrology locations out of a set of potential metrology locations on a substrate; the method comprising: obtaining a parallel sensor description which describes an arrangement of a plurality of metrology sensors capable of performing parallel metrology; identifying a plurality of candidate acquisition configurations based on said parallel sensor description and said potential metrology locations, wherein each candidate acquisition configuration describes a particular position of said sensor description with respect to said substrate and therefore a corresponding one or more of said potential metrology locations; evaluating each of said candidate acquisition configurations in terms of an evaluation metric; and defining said sampling scheme as that comprising the corresponding metrology locations for each selected acquisition configuration.

These and other features and advantages of particular embodiments of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figures 1A, 1B:
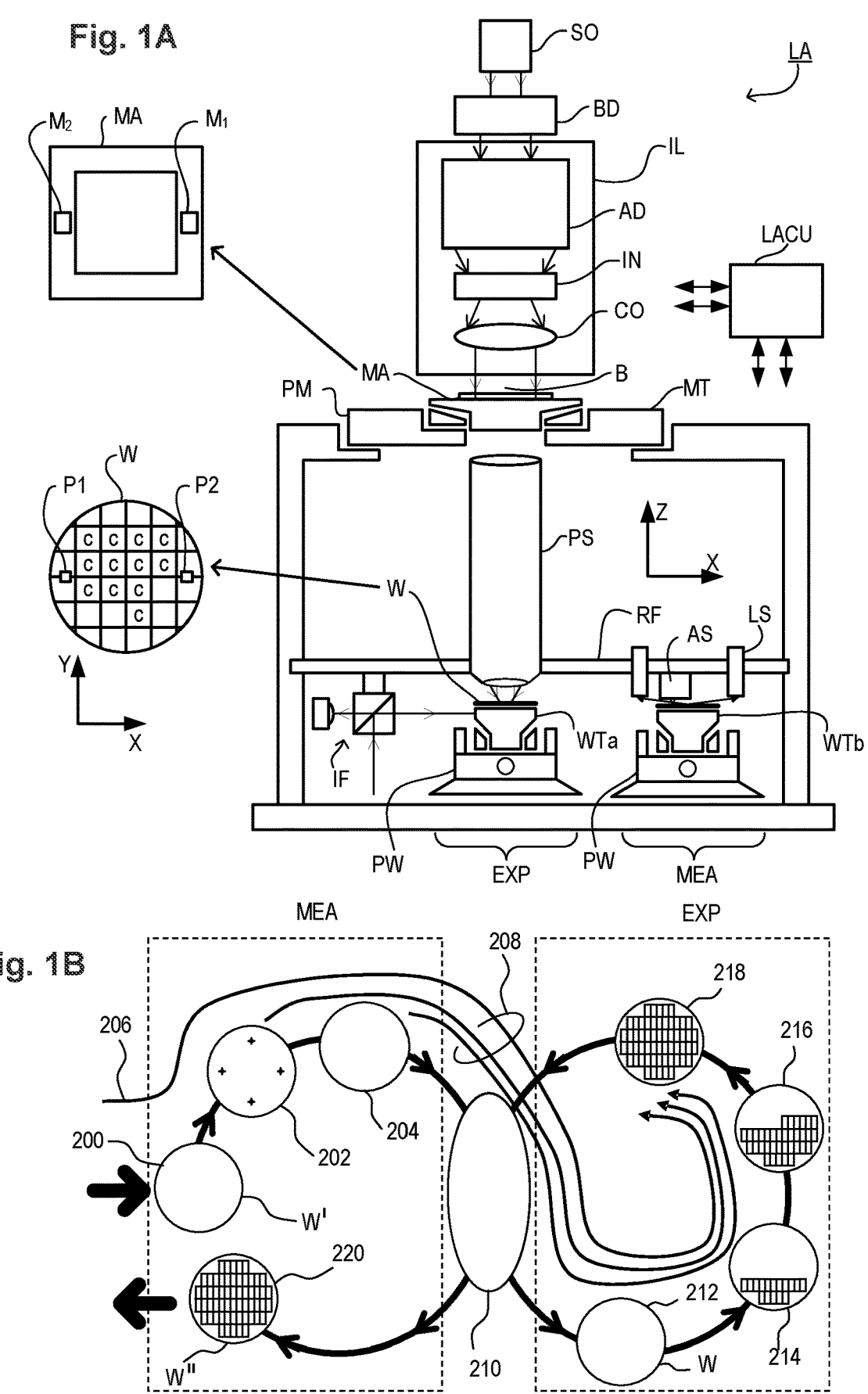
FIG. 1A depicts a lithographic apparatus according to an embodiment of the invention.
FIG. 1B illustrates schematically the stages in the measurement and exposure processes in the apparatus of FIG. 1A, according to known practice.

FIG. 1(a) schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1(a), the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1(a)) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

FIG. 1(b) illustrates the known steps to expose target portions (e.g. dies) on a substrate W in the dual stage apparatus of FIG. 1(a). On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of wafer height against X-Y position is measured also, for use in accurate focusing of the exposed pattern.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, wafers W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The concepts disclosed herein will mainly be described in the context of overlay metrology and/or alignment metrology. However, this must not be taken as a limitation to such contexts; the concepts herein are applicable to any metrology, using a multiple sensor setup, of a proper subset of multiple potential measurement points. In any such context, a sampling scheme optimization to determine the proper subset can be expected to provide a benefit. Therefore, while alignment models will now be described for purposes of exemplary illustration, the concepts disclosed herein can also be used, for example, with exposure-dose correction models, and/or with focus correction models. Such models are well known to the skilled person and will not be described in any detail.

Advanced Alignment Models

Current standard alignment models may have six parameters (effectively three per direction X & Y) and in addition there are more advanced alignment models. On the other hand, for more demanding processes, to achieve the desired overlay performance requires more detailed corrections of the wafer grid. Advanced alignment models have been developed for this purpose. In this text, 'advanced' alignment models refers to all type of models with more complexity than the standard six parameters. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on third and higher order polynomial functions. Zone alignment is described for example in Huang et al, "Overlay improvement by zone alignment strategy", Proc. SPIE 6922, 69221G (2008), which is incorporated herein by reference. Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

Even in embodiments with multiple substrate tables WTa/WTb, the time taken to obtain sufficient measurements for advanced alignment on each wafer eventually impacts throughput. Reducing the time per measurement tends to decrease the accuracy of each measurement, so that the impact on throughput is hard to avoid. In addition, once corrections have been applied in one layer using an advanced alignment model, the same level of detail should be applied in subsequent layers, or the corrections in the first layer become a source of error in the overlay of subsequent layers. The manufacturer therefore has a difficult choice whether to accept further measurement overhead by using the advanced model in subsequent layers, or to suffer an overlay penalty by reverting to a simpler alignment model in subsequent layers, measuring fewer marks.

There is a large degree of similarity in the problems faced for alignment and model estimation/correction calculation. The commonality is that a certain systematic pattern is estimated using a limited set of measurements taken at certain locations. The positions from which measurements are selected for inclusion in the estimation process, determines how reliable the resulting model is. This is because not all measurement positions are necessarily equally informative for the estimation procedure.

Some HVM (High Volume Manufacturing) measurement schemes almost invariably sample a couple of fields on the substrate densely while covering the rest of the substrate in a sparse fashion (e.g. one metrology point per field). This is already suboptimal for the models currently in use, and more serious problems begin to occur for higher order models. This applies to metrology performed for alignment (e.g., using an alignment sensor to align the substrate with respect to projection optics prior to exposure) and post-exposure metrology for process monitoring.

In a lithographic apparatus such as shown in FIG. 1(*a*), alignment is performed for each substrate prior to exposure. Multiple metrology points (e.g., alignment marks) are used to capture the shape of the substrate and to average out placement noise (e.g., originating from the lithographic apparatus baseline). Additionally, to monitor the process and determine corrections therefor as part of a process control arrangement, a post-exposure metrology tool (e.g., a scatterometry based tool or e-beam tool) may be used to measure a parameter of interest (e.g., overlay, focus, critical dimension or any other metric) from multiple metrology points (e.g., metrology targets). In each case, several measurement targets may be placed in each field on the wafer. To limit the cost of metrology only a subset of these possible measurement locations are actually measured and used as input for a control algorithm that determines from these measurements the appropriate stage position and/or other exposure parameters (e.g., focus dose etc.) and corrections (over the field, over the wafer, over the lot) for the lithographic exposure system or other processing equipment. Some current algorithms for alignment focus, dose or other exposure parameters determine which metrology locations are sampled based on covering the substrate in a uniform fashion, uniformity being defined as being equal distances between neighboring metrology points.

To improve on this, WO2015/110191 (which is incorporated herein by reference) describes methods for determining a measurement scheme or sampling scheme (e.g., describing which metrology locations are to be measured from all available metrology locations), which may be referred to as sample scheme optimization (SSO). Such a method comprises evaluating candidate metrology locations; for example, to determine how much the informativity of the sample scheme would improve if that metrology location were selected. This may comprise evaluating all candidate metrology locations and selecting the one which is determined will add the most information for the measurement scheme. More specifically, each selected metrology point may have an associated exclusion zone around it and candidate points may comprise only potential metrology locations located outside of these exclusion zones. This ensures that the overall sampling scheme is distributed sufficiently over the substrate.

Alternatively, the sampling scheme may be devised which measures the selected targets in a sequential way optimized for throughput (optimal routing). A hybrid of these approaches is also possible; e.g., a sampling scheme which maximizes informativity while also taking into account throughput/routing (e.g., via a weighting of these two considerations in the evaluation, or other method).

For each measurement the sensor needs to be positioned with respect to the target. Therefore the wafer needs to be moved with respect to the sensor. This can be done by moving the sensor in x- and y, or moving the wafer in x- and y or a combination thereof.

The aforementioned methods disclosed in WO2015/110191 were devised with a single sensor metrology device in mind, i.e., a metrology device operable to measure a single metrology point at a time. Since then, parallel sensor metrology devices have been envisaged and described, comprising a plurality (e.g., between 2 and 10, or optionally equal to 10 or more, for example, between 2 and 25) of sensors, to enable parallel/simultaneous measurement of multiple metrology points (i.e., one per sensor). Such parallel sensor metrology devices are envisaged for both alignment and post-exposure metrology and the below disclosure is equally applicable to either type of device or any other metrology device for which a sampling subset of available metrology points is selected.

Figures 2A, 2B:
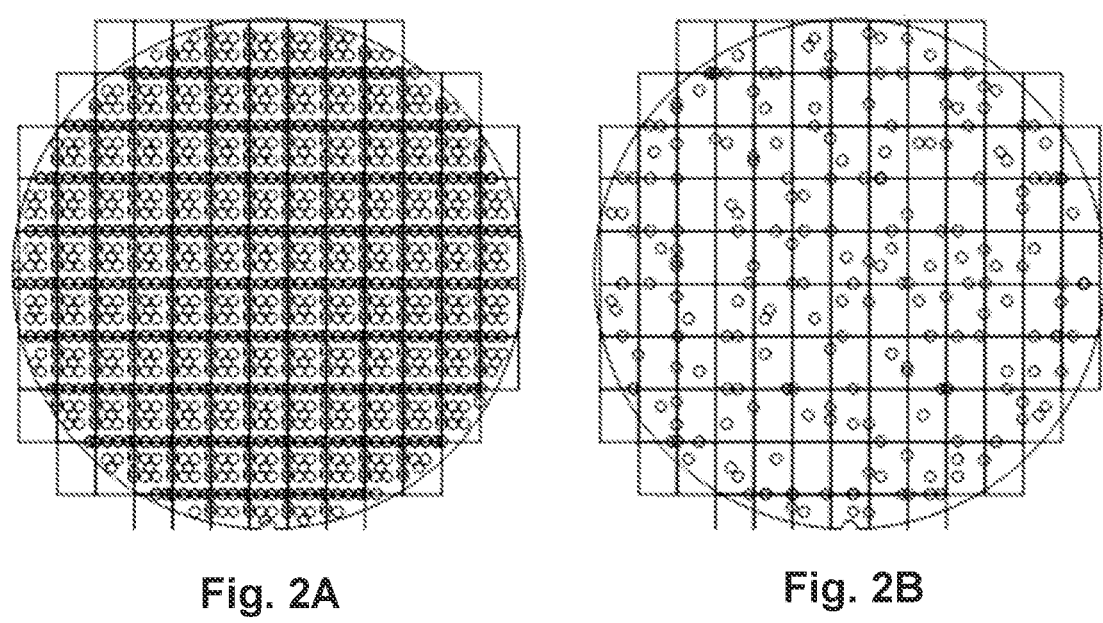
FIG. 2A depicts possible metrology locations on a substrate.
FIG. 2B depicts exemplary selected metrology locations according to a sample scheme optimization.

FIG. 2(a) depicts an example arrangement of available targets on a wafer (in this specific example the target number is 1627). The same arrangement of targets is available for each field because each field is imaged by the same reticle.

It is not cost effective, and not required from a control perspective, to measure all targets. Instead, an "optimal" subset is selected (e.g., using SSO) which provides the most value for the underlying model used to apply scanner corrections to minimize overlay (on the next wafers), for an underlying model for other exposure parameters or for an alignment model. Note that the target layout may be very structured (e.g., as depicted in FIG. 2(a)) because of the repetition from field to field at a fixed pitch.

In FIG. 2(b) an example sampling scheme output from such an SSO (e.g., as described WO2015/110191) is shown. From the available 1627 targets only a proper subset of 220 targets is selected for measurement during the metrology step. Based on these 220 measurements the process optimization or alignment model is updated. The number of targets selected is a compromise between cost of metrology and process improvement (e.g., overlay reduction). In contrast to FIG. 2(a) the layout shown in FIG. 2(b) is no longer structured; the SSO process results in an effective 'randomization' of the targets measured. In a single sensor metrology system, the number of measurement positions equals the number of targets measured. This means that, for such a single sensor metrology tool, 220 wafer stage positions are required to measure all the selected points on the wafer for this sampling scheme.

For a parallel sensor array such as comprising (for example) six parallel pre-adjusted sensors, ideally measurements at six previously unmeasured locations should be performed in parallel for each acquisition configuration (e.g., each sensor grid acquisition position, each sensor move, or more generally each different position of the sensor array with respect to the substrate, whether effected by moving the sensor grid, moving the wafer or moving both). In a specific example, the six sensors may be arranged in a 2×3 grid (of course the sensor array may comprise any number of sensors in any arrangement). The sensors may be pre-adjusted such that the xy-positions of the sensors are adjusted to a fixed grid which is aligned with the field pitch or a multiple thereof. As a result, only $220/6=37$ stage positions should be required to measure 220 metrology points when using a six sensor array (representing an efficiency of $220/(37\times6)=99.1\%$). However, because of the 'randomized' nature of the grid, the number of stage positions required to measure all measurement points of an SSO optimized sampling scheme with such a parallel sensor is typically considerably more. It has been shown, for example, that for a particular SSO optimized sampling scheme, the aforementioned pre-adjusted 2×3 sensor array required a total number of 188 stage positions to measure all of the 220 points. Only at the start of the metrology process was it possible to measure 6 unmeasured targets in parallel; quickly the number of previously unmeasured targets (of the optimized sampling scheme) measured per stage position dropped to only 1 or 2. For such a case, the resulting efficiency is $220/(188\times6)=20\%$.

It is proposed to include (design) knowledge of the parallel metrology into the SSO algorithm with the objective to optimally use the potential of parallel sensors in a metrology tool. Note that the objective of the sampling scheme optimizer remains the same: gather as much as possible (overlay) model relevant data at minimal cost of metrology. However, to use all parallel sensors efficiently, the sampling scheme such be such that it approximates a convolution of the sensor array grid with a reduced sampling grid. In other words, the sampling scheme (and routing) is optimized such that, after every move, all sensors are in a position to measure a target, and more preferably a target which has not been previously measured, e.g., such that the number of unmeasured targets measurable after each move is maximized and/or the number of targets measured multiple times is minimized. As a result of the proposed "parallelism aware SSO" the randomization of the target scheme will be reduced. Throughout, the term "parallel metrology" may include metrology steps where only one metrology location is measured (e.g., at a wafer edge).

Figure 3:
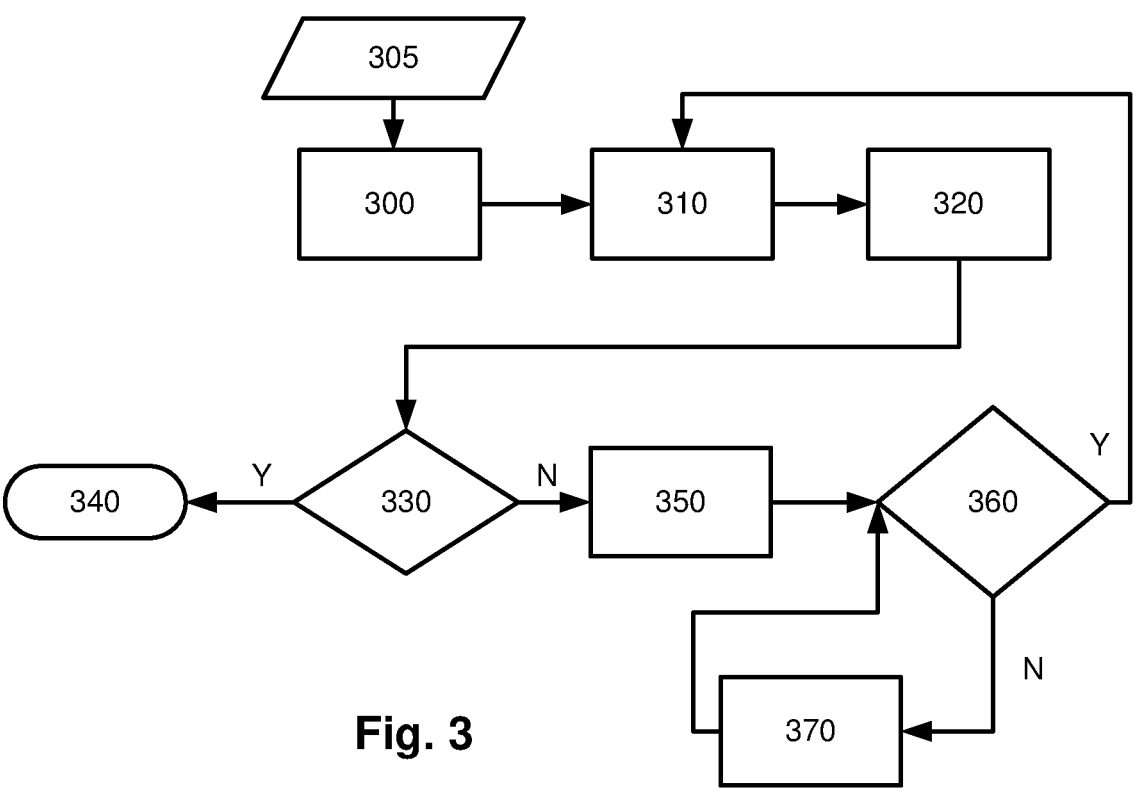
FIG. 3 is a flowchart illustrating a sample scheme optimization method according to an embodiment of the invention.

FIG. 3 is a flowchart describing an algorithm which selects metrology locations for an estimation process, given a certain model. At the same time it attempts to position selected metrology locations in a uniform way, such that the two objectives are balanced. The methods described herein may relate to a multiple sensor metrology device with the sensors maintained in a fixed relation to one another (i.e., in a fixed grid).

The algorithm takes as an input a list of potential metrology locations or metrology target locations 305. The list of potential metrology locations 305 may originate from different sources. For example, the list 305 may originate from existing measurement data, where all potential metrology locations are measured. Alternatively, the list 305 may originate from a list of possible locations on a reticle, the possible locations comprising those where a metrology target can be inserted according to the reticle design. Accordingly the list of potential metrology locations 305 may comprise locations where a metrology location already exists, and/or where there is no metrology location, but there is the potential to locate one there.

The first step of the flowchart may comprise initializing the sample scheme 300. The step comprises selecting one or other (small) number of initial selected acquisition configurations (e.g., stage positions with respect to the substrate) for the measurement scheme. The initial selected sensor grid acquisition location(s) may be selected according to one or more criteria in accordance with the wafer alignment model. The initial selected acquisition configuration(s) may be selected to maximize the number of valid metrology locations or targets measured per grid position, without repetition (i.e., where there are more than one initial selected acquisition configurations, none of the selected acquisition configurations comprise the same metrology locations). Where multiple initial grid acquisition positions are selected, they may include positions such that the initially selected metrology locations are well distributed on the substrate. For each of the initial selected acquisition configuration(s), the corresponding metrology locations are added to the sampling scheme.

Optionally, the initialization step 300 may also include defining an exclusion zone around each selected metrology location corresponding to the one or more initial selected acquisition configurations. The exclusion zone defines a region around each selected metrology point such that other metrology points within the exclusion zones are not considered for inclusion in the sample scheme; i.e., they are removed from being candidate metrology points (at least for one iteration, they may be included again later). All of the metrology points outside of the exclusion zones are candidate metrology points i.e. "selectable" in future iterations. The exclusion zones may, for example, be circular and centered on each selected metrology location, i.e., all metrology locations within a certain distance of a selected metrology location may be within an exclusion zone. The size of the exclusion zones may be variable, such that, for example, if there are insufficient candidate points, the exclusion zones can be made smaller to increase their number. The size of the exclusion zones may also be a function of location on the substrate, e.g., so as to bias target selection towards or against particular regions (e.g., having smaller exclusion zones at the substrate edge to encourage selection at edge locations, where distortion may be expected to be greater). This may be effected by applying a position-dependent scaling factor to the exclusion zones.

Evaluation step 310 may comprise evaluating all candidate acquisition configurations. Candidate acquisition configurations may comprise all acquisition configurations for which all (or above a certain number) of the corresponding metrology locations (i.e., the metrology locations measured by the sensor grid when at that sensor grid acquisition location) comprise candidate metrology locations; i.e., metrology locations not already selected and not within an exclusion zone.

The evaluation step may be based on any suitable evaluation metric. One such evaluation metric may comprise an efficiency metric, e.g., based on how efficiently the sensors are being used for each candidate acquisition configuration. An efficient use of a sensor may be the measurement of an as yet unmeasured metrology point. For example, the candidate acquisition configuration chosen may be one which maximizes the number of unmeasured metrology locations, and/or dismisses as candidate acquisition configurations, any which are below an efficiency threshold such as fewer than 100%, or 80% of sensors measuring unmeasured points. This threshold may optionally be variable, e.g., to increase the number of candidate acquisition configurations available. Other efficiency metrics include a distribution metric, e.g., one which aims to maximize the distribution of measurement locations or an informativity metric which aims to add the most information (e.g., the candidate acquisition configuration which has the maximum total information added by the corresponding metrology locations). It may be noted that a candidate acquisition configuration adding five new metrology locations may add more information (according to an informativity metric) than another candidate acquisition configuration adding six new metrology locations.

An example of a distribution metric may include one for which a certain metrology location density is specified. For example, the wafer and/or field may be divided into regions, with a particular number of measured points defined per region. When the specified number of measured points or target density for a region is reached, no more points can be selected within that area. The density may be globally uniform over the wafer, and/or uniform over the field for a stacked scheme (with all fields overlaid). Alternatively, different distribution metrics (metrology location densities) may be defined for different regions; e.g., with a higher density in regions with more expected local variations such as the edge of the wafer. In another approach, the distribution metric may be based on the distribution of distances between each of the metrology locations and its nearest neighbors, and the distribution of the open areas (e.g., a maximum radius of any circle which can be put in between selected points). These parameters can describe the level of randomness or non-uniformity at a local level. In general it may be desirable to have a limited randomness to avoid 'voids' in the sampling scheme A hierarchal approach may be taken, where candidate acquisition configurations are first evaluated according to a first evaluation metric at a first level and a second evaluation metric at a second level. For example, the evaluation may comprise evaluating the number of unmeasured metrology points which would be measured for each candidate acquisition configuration (efficiency metric) and then a distribution metric describing how well distributed across the wafer the sampling scheme will be when including the metrology locations corresponding to each candidate acquisition configuration. The method may comprise ranking the candidate acquisition configurations, firstly in terms of the number of corresponding unmeasured candidate metrology locations, and then in terms of maximizing the distribution metric so as to maximize the distribution or coverage of measurement locations selected across the wafer (e.g., according to a distribution metric).

Alternatively, or in combination (e.g., as a sole metric or at any level of a hierarchy with one or more other metrics), the evaluation step 310 may comprise calculating how much the informativity (i.e., according to an informativity metric) of the sample scheme would improve if all corresponding metrology locations of each candidate acquisition configuration are added to the sample scheme. The concept of quantifying informativity is described in the aforementioned WO2015/110191. Briefly, a criterion which may be used in the evaluation step 310 may be D-optimality, as will be described below.

Informativity in this context may be coupled to the control scheme, the underlying model and/or the expected statistical distribution. For example, scheme A is more informative than scheme B if the expected value of the control error using scheme A is lower than that of using scheme B. By way of specific example related to control: if the control model only allows a tilt over the field, points at the center are less informative than points at the edge of the field, since a small measurement error will end up as a larger slope error for points at the center. In another specific example related to variability: if more variability is expected at the center of the wafer, then it is better to increase the sampling density at the center, since there will be more averaging on the most noisy points (the center of the wafer is a known hotspot for focus because of the spinning process of the resist and barc).

At step 320, a candidate acquisition configuration is chosen based on the evaluation of all candidate acquisition configurations, and the corresponding metrology locations added to the sampling scheme.

For example, the candidate acquisition configuration chosen may be one which (as a first criterion) maximizes the number of unmeasured metrology locations and then (as a second criterion) the one which is determined to maximize the distribution of measurement locations and/or add the most information (e.g., the candidate acquisition configuration which has the maximum total information added by the corresponding metrology locations).

At step 330, it may be determined whether the measurement scheme has sufficient selected (unique) metrology locations. If it does, the algorithm ends 340. If the measurement scheme does not have selected (unique) metrology locations then, at step 350, an exclusion zone may be defined around each of the newly selected metrology locations, e.g., in addition to exclusion zones defined around each of the other selected metrology locations. Alternatively or in addition, the method may be repeated for a number of iterations corresponding to a particular number of acquisition configurations, with the number of metrology locations in the optimized sample scheme therefore being variable (e.g., provided a minimum number is met). Alternatively or additionally, the method may be repeated for a number of iterations till a threshold value for the informativity metric and/or distribution metric is met by the sampling scheme.

At step 360, it may be determined whether there are a sufficient number of candidate metrology locations and/or candidate acquisition configurations remaining for the algorithm to select from, e.g., while maintaining a proper balance between informativity and uniformity.

In an embodiment, if it is determined that there are too few candidate acquisition configurations, this may be addressed at step 370 by shrinking the exclusion zones. The exclusion zones may be shrunk for all of the selected metrology locations comprised in the measurement scheme at that time, or for only a subset of these selected metrology locations. It may be decided to only shrink some of the exclusion zones depending on various criteria. Such criteria may comprise the size of the exclusion zone or its position. The shrinking of the exclusion zones may be by a predetermined amount or by a predetermined percentage.

Following step 370, the determination step 360 and (if necessary) shrinking step 370 are repeated iteratively until there are a sufficient number of candidate acquisition configurations/and or candidate metrology locations from which to complete the measurement scheme. When there are sufficient candidate acquisition configurations, the evaluation step 310 is repeated and another iteration of the algorithm (steps 310 to 370) is begun.

Figure 4:
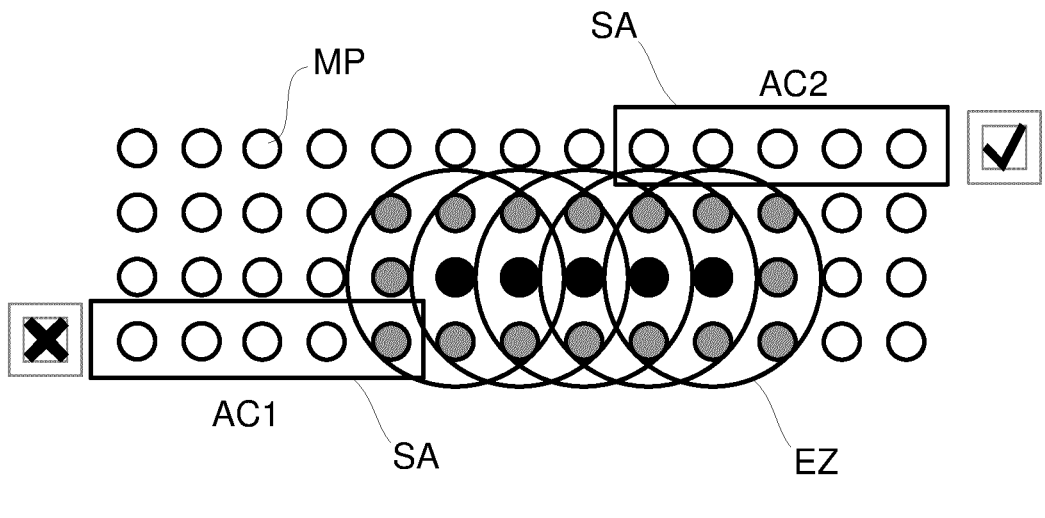
FIG. 4 illustrates a first measurement strategy based on the sample scheme optimization method of FIG. 3.

FIG. 4 illustrates step 310. It shows an array of metrology points MP of part of a substrate. The black metrology points are those having been measured, e.g., in this example corresponding to a single acquisition configuration of a linear sensor array comprising 5 sensors able to measure 5 points in parallel. Around each of these measured metrology points, an exclusion zone EZ (here circular though other shapes are possible) is defined, and any metrology points within an exclusion zone EZ (grey points) are removed from being candidate points. It may then be decided that any candidate acquisition configurations comprise only candidate metrology points, such that any acquisition configuration comprising one or more (e.g., gray) points within an exclusion zone are excluded from consideration. As such, acquisition configuration AC1 is not a candidate acquisition configuration, while acquisition configuration AC2 is a candidate acquisition configuration. Of course, the rule defining candidate acquisition configurations may differ by allowing those acquisition configurations comprising one or more non-candidate metrology points. The number of non-candidate metrology points may be variable, e.g., to increase the number of candidate acquisition configurations should there be an insufficient number. This can be done as an alternative, or in combination with shrinking exclusion zones.

Figure 5:
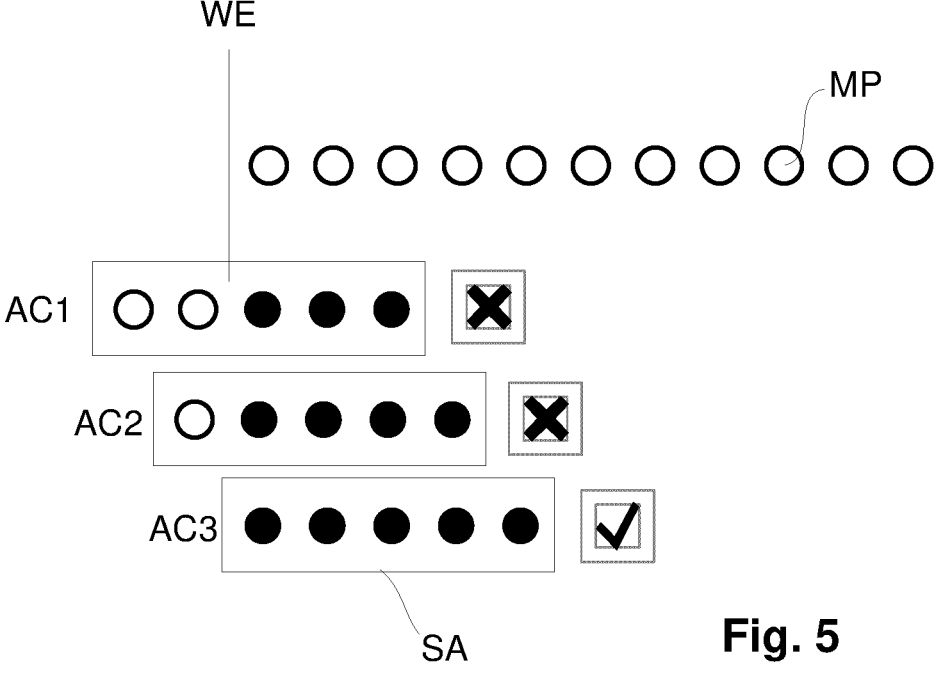
FIG. 5 illustrates a second measurement strategy based on the sample scheme optimization method of FIG. 3.

FIG. 5 illustrates a specific example of evaluation based on an efficiency metric. It shows a row of metrology points MP adjacent the wafer edge WE. Three potential acquisition configurations AC1, AC2, AC3 for the sensor array SA are shown (each corresponding to the same row as row of metrology points MP, but each displaced one column respectively). The efficiency metric may minimize the number of sampling positions for which not all the sensors are able to measure a measurement point on the wafer. In particular, sampling positions where all measurement points overlap with a sampling position that comprises more measurement points (and preferable more unmeasured measurement points should be avoided and therefore removed from being candidate acquisition configurations. As such, acquisition configurations AC1, AC2 are deemed not to be candidate acquisition configurations as they overlap and comprise fewer points than acquisition configuration AC3.

The proposed method may further include optimizing the routing of the sensor array (i.e., the order of the selected acquisition configurations) for throughput.

It can be shown that the parallel aware SSO methodology, in an example, resulted in a sampling scheme comprising metrology locations which can be measured using only 56 acquisition configurations or stage positions. The resulting efficiency therefore is 319/(56×6)=95%. Compared to the previous example, more points are measured for much fewer stage positions (factor 319/56=5.7×).

In an optional embodiment, the pitch of the parallel sensor array may be selected to be equal to the field grid, or a (e.g., small) multiple of the grid. For cases where the intrafield locations of the targets are on a regular grid, it is proposed that the pitch of the sensor grid may also be chosen to include this intrafield pitch. For example, the pitch $P_{x,SA}$ of the sensor array grid in a first direction (parallel to the substrate plane, e.g., the x-direction) may be defined as:

$$P_{x,SA}=N_1 P_{x,field}+N_2 P_{x,intrafield}$$

where $P_{x,field}$ is the field pitch in the first direction and $P_{x,intrafield}$ is the intrafield pitch in the first direction. $N_1$ may be any small integer, e.g., below 10; $N_2$ may also be any small integer below 10 e.g., more specifically 0 or 1. Similarly, the pitch $P_{y,SA}$ of the sensor array grid in a second direction (perpendicular to the first direction and parallel to the substrate plane, e.g., the y-direction) may be defined as:

$$P_{y,SA}=N_3 P_{y,field}+N_4 P_{y,intrafield}$$

where P is the field pitch in the second direction and $P_{y,intrafield}$ is the intrafield pitch in the second direction. $N_3$ may be any small integer, e.g., below 10; $N_4$ may also be any small integer below 10, e.g., more specifically 0 or 1.

In a further embodiment, the proposed SSO algorithm may be used to determine the optimal value for one or more of: $N_1$, $N_2$, $N_3$, $N_4$; a low number will have advantages of a more compact sensor array which is less prone to misalignment, while a higher number will cover more across-wafer information in one parallel acquisition. Such a method may comprise optimizing for one or both of $N_1$ and $N_3$ only (e.g., with $N_2$ and $N_4$ zero) to optimize the sensor pitch to only the field pitch (in one or two directions), or further include optimization for intrafield targets through optimization of $N_2$ and/or $N_4$.

In another optional embodiment, it is proposed to optimize a target layout for the wafer to enable and maximize the value of the parallel aware SSO concept. For example, subsets of targets may be grouped in accordance to the pre-adjusted sensor array (e.g., in the specific example described here, in groups of 2×3).

As mentioned above, criterion which may be used in the evaluation step 310 may be D-optimality. In D-optimal designs, the determinant of the information matrix is maximized (and hence the determinant of the variance covariance matrix is minimized). Assuming a linear model, that is a model which is linear in its parameters, the following equation can be written:

$$\begin{bmatrix} m_1 \\ m_2 \\ \vdots \\ m_n \end{bmatrix} = \begin{bmatrix} C_{11} & C_{12} & \dots & C_{1q} \\ C_{21} & C_{22} & \dots & C_{2q} \\ \vdots & \vdots & \ddots & \vdots \\ C_{n1} & C_{n2} & \dots & C_{nq} \end{bmatrix} \cdot \begin{bmatrix} p_1 \\ p_2 \\ \vdots \\ p_q \end{bmatrix} + \begin{bmatrix} \xi_1 \\ \xi_2 \\ \vdots \\ \xi_n \end{bmatrix}$$

Measurements are denoted by m, parameters by p, residuals by ξ, and the so-called design matrix by C. This design matrix forms the heart of the model, and it is comprised of the basis functions evaluated at selected metrology locations where the respective measurements were taken. Using for example a one dimensional polynomial model in x of orders zero through four, the basis functions would simply be: 1, x, $x^2$, $x^3$ and $x^4$ respectively. Therefore, if a measurement were to be available for location x=3, not taking into account normalization, the corresponding row in C would be: [1 3 9 27 81].

The modeling process may then proceed as follows:
1. measurements at selected metrology point locations are (made) available;
2. a suitable model form (i.e. a set of basis functions) is chosen so as to capture the relevant information underlying the data;
3. a minimization is performed yielding parameter values which minimize the distance in some mathematical norm between the model and the measurement data, this minimization may take the form of a least squares modeling.

Keeping the same notation as in the above, the optimization problem solved in least squares estimation is as follows:

$$\min_p \|m - C.p\|_2^2 = \min_p (p^T \cdot C^T \cdot C \cdot p - 2 \cdot p^T \cdot C^T \cdot m) = \min_p \rho(p)$$

Which in turn can be solved as follows:

$$\frac{\partial \rho}{\partial p^T} =$$

$$2 \cdot C^T \cdot C \cdot p - 2 \cdot C^T.m \equiv 0 \rightarrow C^T \cdot C \cdot p = C^T \cdot m \rightarrow p = \left[ C^T \cdot C \right]^{-1} \cdot C^T$$

$C^T C$ is the information matrix, and its inverse $[C^T C]^{-1}$ is the variance-covariance matrix. The information matrix and variance-covariance matrix both indicate how informative the measurement layout (i.e. the experiment) is for the chosen model; i.e., how well the layout will allow differentiation of the parameters (it should be noted that actual measurement values are not used for this). So, minimizing the determinant of the variance-covariance matrix or maximizing the determinant of the information matrix will yield the same result.

It is reiterated that while the above description is couched in terms of overlay and alignment, it is not so restricted. The methods disclosed herein can be used in metrology of any type of feature which can be measured/modeled (e.g., Critical Dimension, Focus, Side Wall Angle, etc.). The more expensive the metrology, the greater the added value of an intelligent sample scheme of reduced size.

While the method of FIG. 3 describes adding points till there is a sufficient number of metrology locations and/or acquisition configuration, this is only one method of performing such a sampling scheme optimization. An alternative method may begin with an initial oversampled scheme comprising more sampling positions than desired. In the evaluation step, candidates for removal from the scheme may be identified and those evaluated as most redundant (and/or identified as redundant based on a threshold for the evaluation metric) removed, thereby selecting those remaining. Another alternative approach may start with a desired number of sampling positions with a random or any other non-optimized distribution and then repeatedly redistributes one or more sampling positions to optimize the evaluation metric(s) (e.g., increase the informitivity, distribution and/or efficiency).

Figure 6A:
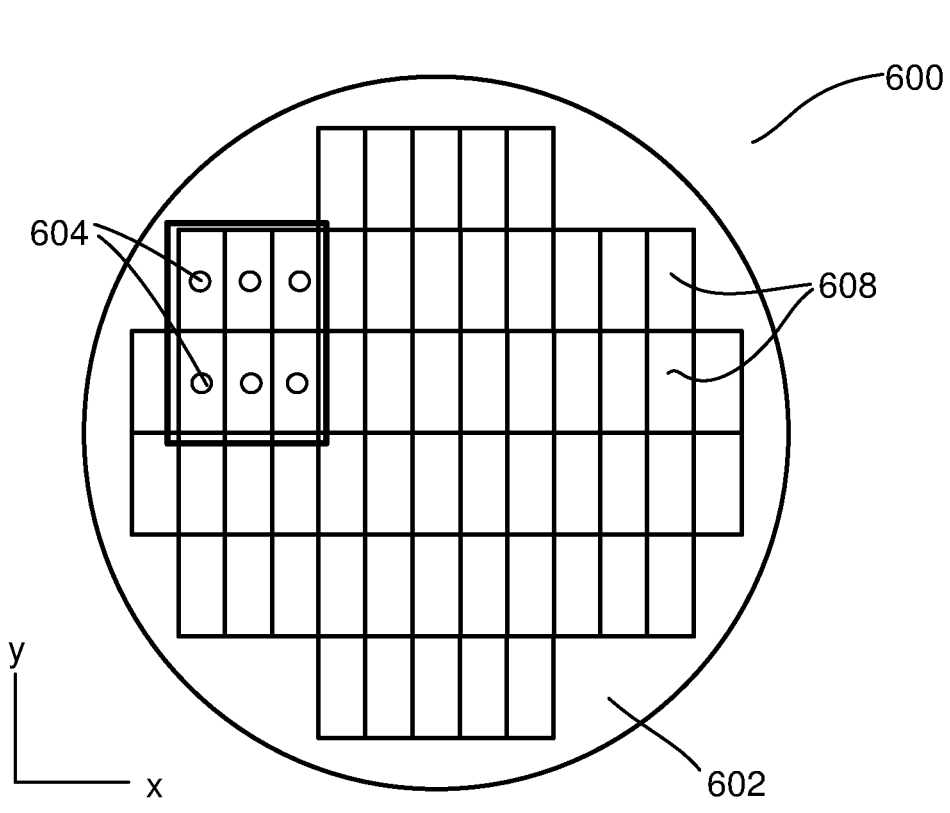
FIGS. 6A and 6B show two views of a parallel sensor metrology device which may utilize a sample scheme optimization method, according to an embodiment.
Figure 6B:
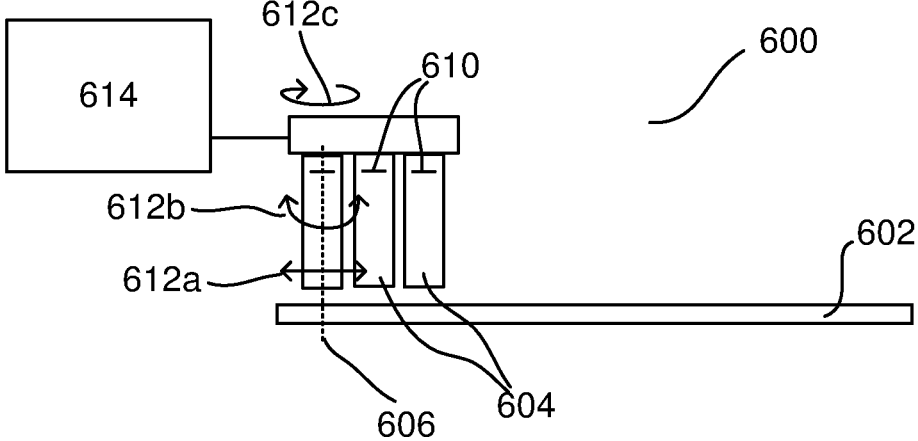

FIGS. 6(a) and 6(b) respectively show plan and side view schematic representations of metrology tool arrangement 600 comprising an array of detection optical systems which can carry out metrology on multiple targets in parallel and that may implement the methods described herein. Such an arrangement is described in more detail in WO2018/238363 (particularly in relation to FIGS. 9a, 9b and 10 of that document), which is incorporated herein by reference.

Each of the detection optical systems may comprise a detection optical sensor 610 and at least one lens for capturing a portion of illumination radiation scattered by the structure and transmitting the captured radiation towards the detection optical sensor 610. As such, the detection optical system may form part of a metrology tool for determining a parameter of interest of a structure fabricated on a substrate, the metrology tool additionally comprising: an illumination optical system for illuminating the structure with illumination radiation. Hence, each of array elements 604 shown in FIG. 6 may comprise a detection sensor without the illumination optical system. For the purposes of the following description, each of the optical detection systems will be referred to as elements of the array, or array elements 604. Each of the array elements 604 may include an optical detector sensor 610. The optical detector sensor has a sensor axis 606 which extends orthogonally between the detection optical sensor 610 and plane of the substrate 602.

The substrate 602 includes a plurality of dies 608, as indicated by the lines shown in FIG. 6(a). Each of the array elements 604 may be positioned in relation to an individual die 608 and take metrology data therefrom. Hence, each of a plurality of dies 608 may include a single element array 604. The array elements 604 may be located in a common horizontal location with respect to each of the dies 608, such that metrology markers which are common to each of the dies and have corresponding positions in the dies can be measured in parallel by each of the sensors 610.

The array may comprise a tiled or tessellated arrangement of optical detection systems. Each optical detection system may be provided in a footprint area having a predetermined shape in which the footprint areas abut one another to provide the array. Each footprint area may be the same and may be polygonal, for example, each footprint area may be triangular, square or hexagonal. In one example, the array may be provided as a tessellation of hexagonal footprint areas to provide a honeycomb array. Thus, the array elements may be arranged in a honeycomb array. The array of optical detection systems is shown as a two dimensional array having m rows and n columns. The rows m may extend a first direction, for example, the x direction of the substrate and the columns may extend in a second direction, for example, the y direction. Either or both of the directions of the rows and columns may be inclined to the x or y direction. In general, the number of rows and columns will each be greater than 2. However, there can be as many rows or columns as desired for a particular field layout on a wafer or metrology footprint. The array may also be any desired shape and is not restricted to being a square or rectangular configuration. The number of array elements 604 can be varied to accommodate different applications. The size of the array may be, for example, up to 15 in the x direction and up to 100 in the y direction. In some examples, a single array element 604 may be provided for each of the respective dies 608 so as to cover the entire wafer. In other applications a discrete number of array elements 604 may be provided which is less than the number of dies 608. Each member of the array elements may be aligned with a different field of the substrate.

As indicated by the arrows 612a, 612b, 612c the array may be adjustable such that the array elements 604 (or parts thereof) is movable in relation to one another or the substrate 602. As shown, adjacent array elements 604 are separated from one another by a first distance. The first distance between adjacent array elements may correspond to the pitch of the dies or metrology targets. The first distance may be the same for all of the respective adjacent pairs of the array elements 604. As shown by arrow 612a, each of the array elements 604 may be moved such that the separation between the adjacent array elements may be altered from the first distance to the second distance. The movement of the array elements 604 may be done in the x and/or y direction.

The spacing may be a fixed pitch in accordance with the pitch of the dies 608 or metrology targets which are distributed across the substrate 602. As such, the spacing of the array elements 604 may be standard and one of a number of predetermined discrete spacing setting which correspond to standard features, such as the pitch of the die. The pitches may be, for example, 26 mm in the x direction and 33 mm in the y direction to correspond to conventional die sizes. Other pitches may include 26 mm by 16.5 mm. The metrology tool 600 may incorporate or have access to a list or library of one or more spacings which are conventional or frequently used. The predetermined spacings may form part of a fabrication recipe or be included as part of a set-up process for a particular process.

In order to obtain good metrology data, it is preferable that the sensor axis 606 be aligned so as to be perpendicular to the plane of the substrate 602 surface. A substrate surface of a processed wafer 602 can show local tilt variations of the order of several 100 microradians. In order to deal with these local tilt variations the array elements may be tiltable 612b so as to alter the angle between the sensor axis 606 and the substrate 602 surface. The tilt may be restricted to two orthogonal directions, for example, x and y directions where tipping the sensor in the x direction would cause the sensor axis to move along the x direction, and tipping the sensor in the y direction would cause the sensor axis to move along the y direction. Combinations of the two tipping directions may allow for any substrate tilt to be accommodated. As the variations in surface level may be local, each of the array elements may be moved independent from the other array elements 604. Typically, when tilting around the x-axis, motion in y direction will occur (and the other way around).

In order to determine the tilt of the array element 604, a tilt sensor may be incorporated within each of the array elements. The tilt sensor may be an optical sensor as known in the art, and may advantageously be incorporated into the optical sensor 610. Thus, each of the array elements 604 may comprise a combined overlay and tilt sensor.

When the metrology tool is being used to obtain overlay metrology data, it is advantageous to be able to correct for measurement errors which result from sensor asymmetry. This error may be referred to as Tool-Induced-Shift, TIS. To address TIS (or other similar issues), the array elements 604 may each be rotatable about the sensing axis 606. As such, each of the array elements 604 may be rotated from a first rotational position to a second rotational position in which the first and second positions are antiparallel to the extent they need to be to account for tool induced shift. Thus, the sensors may be rotated through approximately 180 degrees. The rotation will typically be around the insertion axis 606, however, a positional difference between the first and second rotational positions with respect to the surface of the substrate can be accounted for when processing the acquired metrology data. That is, a shift in the x-y position of the sensing axis 606 which occurs as a result of the rotation may be accommodated by modifying the overlay data with alignment data taken from the respective first and second rotational positions.

The movement of the array elements 604 may be achieved using suitable actuators known in the art. The actuators may be, for example, piezo motors. Thus, each of the array elements 604 may include one more actuators for each of the described ranges of motion.

The metrology tool may incorporate a positional controller 614 to which is configured to control the movement of the array elements 604. As such the positional controller 614 will be in communication with each of the actuators so as to provide the necessary control signals. The positional controller 614 may also be arranged to receive positional data either from the actuators, array elements 604 or some other source which can provide an indication of position of the array elements relative to the substrate 602. The positional controller 614 may be distributed among the element arrays or be provided as a central unit which is arranged to control all of the array elements individually. The central unit may be local to the metrology tool 600 or located remotely. The positional controller 614 may form part of a larger control system. In use, the positional controller 614 may receive or determine a desired spacing between the adjacent array elements before moving each of the array elements 604 into the correct position. Once the array elements 604 have been positioned, the position verified and any adjustments made, metrology data can the obtained as described above.

The array elements 604 may be separately controllable. The array elements 604 may have one or more of the above described ranges of movement. Hence, there may be examples in which the array elements 604 are arranged to tilt but not move in the x-y directions. This may be useful where the spacing of the array elements can be fixed in the x-y directions.

The array element 604 may be similar or equal array elements 604. For example, all array elements may be configured to operate in the same operational wavelength range. Even if the array element 604 are similar or equal, this does not exclude that each array element may receive illumination radiation of another wavelength in the full operational wavelength range of the array element, e.g. different array elements receive light at different wavelengths in the operational wavelength range of 200 to 2000 nm. However, it is not necessary that all array elements 604 are similar or equal to each other. There may be at least one array element 604 that is different from the other array elements 604. The array element 604 may also be subdivided in groups of array elements 604 and within each group of array elements 604 the array element are similar or equal, but they may differ over the groups of array elements 604. For example, a first row or column of the array comprises a first type of array element, the second row or column of the array comprises a second type of array elements, etc. It is to be noted that one array element comprises a combination of an illumination optical system and a detection optical system. If array elements are different, their respective illumination optical systems and/or their respective detection optical systems may differ from each other.

The array of array elements 604 may be provided in the metrology tool at a fixed position, while the metrology tool is configured to move the substrate 602 with, for example, a moveable substrate table. The array of array elements 604 may also be moveable in the metrology tool. For example, the array of array elements 604 may be moveable such that one group of array elements 604 is positioned at a location that is e.g. a central position of the substrate table with the substrate 602. Thereby the centrally located group of array elements 604 can be used for measurements over the whole substrate 602 based on movements of the substrate 602 with respect to the array of array elements 604.

Implementation

Figure 7:
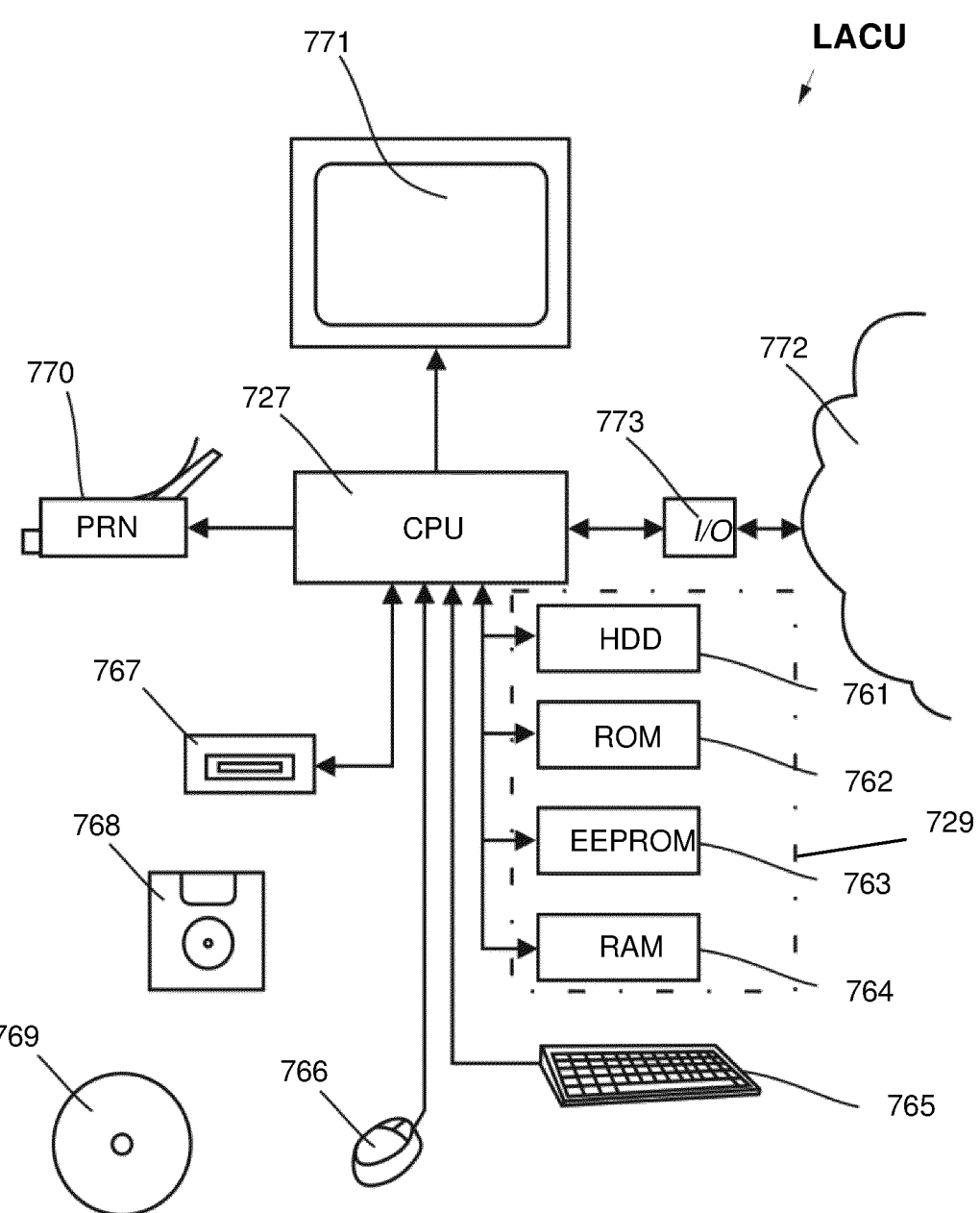
FIG. 7 illustrates computer system hardware useful in implementing the processes disclosed herein.

The steps of the methods described above can be automated within the lithography apparatus control unit LACU shown in FIG. 1(*a*). This unit LACU may include a computer assembly as shown in FIG. 7. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 729 connected to processor 727 may comprise a number of memory components like a hard disk 761, Read Only Memory (ROM) 762, Electrically Erasable Programmable Read Only Memory (EEPROM) 763 and/or Random Access Memory (RAM) 764. Not all aforementioned memory components need to be present. Furthermore, it is not essential that aforementioned memory components are physically in close proximity to the processor 727 or to each other. They may be located at a distance away.

The processor 727 may also be connected to some kind of user interface, for instance a keyboard 765 or a mouse 766. A touch screen, track ball, speech converter or other interfaces that are known to persons skilled in the art may also be used.

The processor 727 may be connected to a reading unit 767, which is arranged to read data, e.g. in the form of computer executable code, from and under some circumstances store data on a data carrier, like a floppy disc 768 or a CDROM 769. Also DVD's or other data carriers known to persons skilled in the art may be used.

The processor 727 may also be connected to a printer 770 to print out output data on paper as well as to a display 771, for instance a monitor or LCD (Liquid Crystal Display), of any other type of display known to a person skilled in the art.

The processor 727 may be connected to a communications network 772, for instance a public switched telephone network (PSTN), a local area network (LAN), a wide area network (WAN) etc. by means of transmitters/receivers 773 responsible for input/output (I/O). The processor 727 may be arranged to communicate with other communication systems via the communications network 772. In an embodiment of the invention external computers (not shown), for instance personal computers of operators, can log into the processor 727 via the communications network 772.

The processor 727 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 727 may even be located a distance away of the other processing units and communicate via communications network 772. Connections between modules can be made wired or wireless.

The computer system can be any signal processing system with analogue and/or digital and/or software technology arranged to perform the functions discussed here.

Further embodiments are disclosed in the subsequent list of numbered clauses:

1. A method of determining a sampling scheme, the sampling scheme describing a proper subset of metrology locations out of a set of potential metrology locations on a substrate; the method comprising:

obtaining a parallel sensor description which describes an arrangement of a plurality of metrology sensors capable of performing parallel metrology;

identifying a plurality of candidate acquisition configurations based on said parallel sensor description and said potential metrology locations, wherein each candidate acquisition configuration describes a particular position of said sensor description with respect to said substrate and therefore a corresponding one or more of said potential metrology locations;

evaluating at least some of said candidate acquisition configurations in terms of an evaluation metric;

selecting a candidate acquisition configuration, based on said evaluation; and defining said sampling scheme as that comprising the corresponding metrology locations for each selected acquisition configuration.

2. A method according to clause 1, wherein said evaluation metric comprises one or more of:

an efficiency metric quantifying the efficiency of a candidate acquisition configuration in terms of use of the plurality of metrology sensors;

an informativity metric quantifying the amount of information added to the sampling scheme by the corresponding metrology locations of a candidate acquisition configuration; and a distribution metric quantifying the coverage of the sampling scheme over the substrate and/or region or field thereof.

3. A method according to clause 2, wherein said selecting step comprises selecting:

a candidate acquisition configuration which is the most efficient according to the efficiency metric;

a candidate acquisition configuration for which the corresponding metrology locations adds the most information to the sampling scheme according to the informativity metric; and/or a candidate acquisition configuration for which the corresponding metrology locations maximizes the coverage of the sampling scheme over the substrate according to the distribution metric.

4. A method according to clause 2 or 3, wherein the evaluation step comprises evaluating according to two or more of said efficiency metric, informativity metric and distribution metric in a hierarchy.

5. A method according to any of clauses 2 to 4, wherein said efficiency metric maximizes the number of unmeasured potential measurement locations corresponding to each candidate acquisition configuration evaluated.

6. A method according to any of clauses 2 to 5, wherein said efficiency metric discounts from said candidate acquisition configurations, acquisition configurations for which all corresponding measurement locations overlap with a acquisition configuration which comprises more measurement locations.

7. A method according to any of clauses 2 to 6, wherein the informativity metric is D-optimality.

8. A method as defined in clause 7, wherein the sampling scheme relates to a modelling scheme, and said method further comprises, for each of the metrology locations corresponding to a candidate acquisition configuration, maximizing the determinant of a design matrix describing said modelling scheme having the metrology locations corresponding to the candidate acquisition configuration, or minimizing the determinant of the variance-covariance matrix corresponding to said design matrix.

9. A method according to any preceding clause, wherein said method comprises:

repeating iterations of performing said evaluation step for a candidate acquisition configuration and, depending on said evaluation, adding or removing corresponding metrology locations to or from the sampling scheme till one or more of the following is met:

the sampling scheme comprises a threshold number of metrology locations;

the sampling scheme relates to a threshold number of acquisition configurations;

a threshold value for the evaluation metric is met by the sampling scheme.

10. A method according to any preceding clause, comprising:

determining an initial sampling scheme comprising a desired number of metrology locations and/or acquisition configurations having a non-optimized distribution; and based on said evaluation, repeatedly redistributing one or more acquisition configurations to optimize the sampling scheme in terms of said evaluation metric.

11. A method according to any preceding clause, wherein the step of identifying a plurality of candidate acquisition configurations comprises an initial step of determining a plurality of candidate metrology locations from said potential metrology locations; wherein each of said candidate acquisition configurations is determined as those with a threshold minimum number of corresponding candidate metrology locations.

12. A method as defined in any preceding clause, wherein an exclusion zone is defined in the vicinity of each metrology location comprised within the sampling scheme, and wherein said candidate metrology locations comprise only potential metrology locations located outside of these exclusion zones.

13. A method as defined in clause 12, wherein said candidate metrology locations comprise all of said potential metrology locations not within an exclusion zone.

14 A method as defined in clause 12 or 13, comprising:

determining there are sufficient candidate metrology locations for a next iteration of the method; and where there are insufficient candidate metrology locations, decreasing the area of some or all of said exclusion zones.

15. A method as defined in any of clauses 12 to 14, wherein each exclusion zone is substantially circular and centered on its corresponding selected metrology location.

16. A method as defined in any of clauses 12 to 15, wherein the area of each exclusion zone varies in accordance with the position of the corresponding selected metrology location on said substrate.

17. A method as defined in clause 16, wherein the area of each exclusion zone tends to increase the nearer that its corresponding selected metrology location is to the center of said substrate.

18. A method as defined in any preceding clause, comprising optimizing an arrangement of said metrology locations on said substrate in accordance with said sensor description.

19. A method as defined in clause 18, wherein said metrology locations are arranged in groups corresponding to said sensor description.

20. A method as defined in any preceding clause, comprising optimizing the arrangement of the plurality of metrology sensors in accordance with at least one substrate grid relating to the substrate.

21. A method as defined in clause 20, wherein the at least one substrate grid comprises one or both of a interfield grid and a intrafield grid.

22. A method as defined in clause 21, wherein said optimizing comprises determining a sensor spacing in at least one direction according to one or the sum of: an integer multiple of a pitch of the interfield grid and an integer multiple of a pitch of the intrafield grid.

23. A method as defined in clause 22, further comprising optimizing said integer multiple for one or both of: the pitch of the interfield grid and the pitch of the intrafield grid.

24. A method as defined in any preceding clause, comprising performing an initialization step wherein an initialization subset of said potential metrology locations are pre-selected for inclusion into said sampling scheme, said initialization subset corresponding to one or more acquisition configurations.

25. A method as defined in any preceding clause, comprising optimizing a routing describing the order of successive acquisition configurations, for measuring the metrology locations described by the sampling scheme.

26. A method as defined in any preceding clause, comprising the step of performing a metrology operation using a metrology tool with said arrangement of a plurality of metrology sensors as described by said sensor description, on said substrate in accordance with said sampling scheme.

27. A method as defined in clause 26, wherein the metrology operation comprises an alignment operation or a post-exposure monitoring operation for monitoring product functionality, overlay, any product dimension, focus and/or dose monitoring operation, or any combination thereof.

28. A computer program comprising computer readable instructions which, when run on suitable processor, cause the processor to perform the method of any one of clauses 1 to 27.

29. A computer program product comprising the computer program of clause 28.

30. A metrology apparatus comprising:

a sensor arrangement comprising an arrangement of a plurality of metrology sensors capable of performing parallel metrology as described by said sensor description;

a processor; and a storage device comprising the computer program of clause 28.

31. The metrology apparatus of clause 30, wherein said sensor arrangement is optimized to maximize one or more of a efficiency metric, an informativity metric or a distribution metric for a given number of sampling locations.

32. The metrology apparatus of clause 30 or 31, wherein the metrology sensors are separated by an integer multiple of the field grid.

33. The metrology apparatus of clause 30, 31 or 32, where the number of metrology sensors is fewer than 10.

34. A lithographic cell comprising a lithographic apparatus operable to expose a pattern on a substrate; and the metrology apparatus according to any of clauses 30 to 33.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method of determining a sampling scheme for collecting metrology data from a set of potential metrology locations on a substrate during a lithographic process, wherein the sampling scheme is implemented by a metrology apparatus comprising a plurality of metrology sensors capable of performing parallel metrology and the potential metrology locations comprise metrology targets patterned on the substrate, the method comprising:

obtaining a parallel sensor description which describes an arrangement of the plurality of metrology sensors capable of performing parallel metrology;

identifying a plurality of candidate acquisition configurations based on the parallel sensor description and the potential metrology locations, each candidate acquisition configuration describing a particular position of the plurality of metrology sensors with respect to the substrate and therefore a corresponding one or more of the potential metrology locations;

evaluating at least some of the candidate acquisition configurations in terms of an evaluation metric;

selecting a candidate acquisition configuration, based on the evaluation; and defining the sampling scheme to be implemented by the metrology apparatus to collect metrology data during the lithographic process as that comprising the corresponding metrology locations for each selected acquisition configuration.

2. The method of claim 1, wherein the evaluation metric comprises one or more of:

an efficiency metric quantifying the efficiency of a candidate acquisition configuration in terms of use of the plurality of metrology sensors;

an informativity metric quantifying the amount of information added to the sampling scheme by the corresponding metrology locations of a candidate acquisition configuration; and a distribution metric quantifying the coverage of the sampling scheme over the substrate and/or region or field thereof.

3. The method of claim 2, wherein the selecting comprises selecting:

a candidate acquisition configuration which is the most efficient according to the efficiency metric;

a candidate acquisition configuration for which the corresponding metrology locations adds the most information to the sampling scheme according to the informativity metric; and/or a candidate acquisition configuration for which the corresponding metrology locations maximizes the coverage of the sampling scheme over the substrate according to the distribution metric.

4. The method of claim 2, wherein the evaluating comprises evaluating according to two or more of the efficiency metric, informativity metric, and distribution metric in a hierarchy.

5. The method according of claim 2, wherein at least one of:

the efficiency metric maximizes a number of unmeasured potential measurement locations corresponding to each candidate acquisition configuration evaluated, and the efficiency metric discounts from the candidate acquisition configurations, acquisition configurations for which all corresponding measurement locations overlap with an acquisition configuration which comprises more measurement locations.

6. The method of claim 2, wherein:

the informativity metric is D-optimality, and the sampling scheme relates to a modelling scheme, and the method further comprises, for each of the metrology locations corresponding to a candidate acquisition configuration, maximizing a determinant of a design matrix describing the modelling scheme having the metrology locations corresponding to the candidate acquisition configuration, or minimizing a determinant of the variance-covariance matrix corresponding to the design matrix.

7. The method of claim 1, further comprising:

repeating iterations of performing the evaluating for a candidate acquisition configuration and, depending on the evaluating, adding or removing corresponding metrology locations to or from the sampling scheme till one or more of the following is met:

the sampling scheme comprises a threshold number of metrology locations;

the sampling scheme relates to a threshold number of acquisition configurations;

a threshold value for the evaluation metric is met by the sampling scheme.

8. The method of claim 1, further comprising:

determining an initial sampling scheme comprising a desired number of metrology locations and/or acquisition configurations having a non-optimized distribution; and based on the evaluating, repeatedly redistributing one or more acquisition configurations to optimize the sampling scheme in terms of the evaluation metric.

9. The method of claim 1, wherein:

the identifying a plurality of candidate acquisition configurations comprises an initial determination of a plurality of candidate metrology locations from the potential metrology locations, and each of the candidate acquisition configurations is determined as those with a threshold minimum number of corresponding candidate metrology locations.

10. The method of claim 1, further comprising:

optimizing an arrangement of the metrology locations on the substrate in accordance with the sensor description, and the metrology locations are arranged in groups corresponding to the sensor description.

11. The method of claim 1, further comprising:

optimizing the arrangement of the plurality of metrology sensors in accordance with at least one substrate grid relating to the substrate, and the at least one substrate grid comprises one or both of an interfield grid and an intrafield grid.

12. The method of claim 1, further comprising:

performing an initialization step, wherein an initialization subset of the potential metrology locations are preselected for inclusion into the sampling scheme, the initialization subset corresponding to one or more acquisition configurations.

13. A computer program comprising computer readable instructions which, when run on suitable processor, cause the processor to perform a method for determining a sampling scheme for collecting metrology data from a set of potential metrology locations on a substrate during a lithographic process, wherein the sampling scheme is implemented by a metrology apparatus comprising a plurality of metrology sensors capable of performing parallel metrology and the potential metrology locations comprise metrology targets patterned on the substrate, the method comprising:

obtaining a parallel sensor description which describes an arrangement of the plurality of metrology sensors capable of performing parallel metrology;

identifying a plurality of candidate acquisition configurations based on the parallel sensor description and the potential metrology locations, each candidate acquisition configuration describing a particular position of the plurality of metrology sensors with respect to the substrate and therefore a corresponding one or more of the potential metrology locations;

evaluating at least some of the candidate acquisition configurations in terms of an evaluation metric;

selecting a candidate acquisition configuration, based on the evaluation; and defining the sampling scheme to be implemented by the metrology apparatus to collect metrology data during the lithographic process as that comprising the corresponding metrology locations for each selected acquisition configuration.

14. A metrology apparatus comprising:

a sensor arrangement comprising an arrangement of a plurality of metrology sensors capable of performing parallel metrology as described by the sensor description;

a processor; and a storage device comprising a computer program comprising computer readable instructions which run on suitable processor, the processor configured to:

obtain a parallel sensor description which describes an arrangement of a plurality of metrology sensors capable of performing parallel metrology;

identify a plurality of candidate acquisition configurations based on the parallel sensor description and the potential metrology locations, each candidate acquisition configuration describing a particular position of the sensor description with respect to the substrate and therefore a corresponding one or more of the potential metrology locations;

evaluate at least some of the candidate acquisition configurations in terms of an evaluation metric;

select a candidate acquisition configuration, based on the evaluation; and define the sampling scheme as that comprising the corresponding metrology locations for each selected acquisition configuration.

15. A lithographic cell comprising:

a lithographic apparatus operable to expose a pattern on a substrate; and a metrology apparatus comprising:

a sensor arrangement comprising an arrangement of a plurality of metrology sensors capable of performing parallel metrology as described by the sensor description;

a processor; and a storage device comprising a computer program comprising computer readable instructions which run on suitable processor, the processor configured to:

obtain a parallel sensor description which describes an arrangement of a plurality of metrology sensors capable of performing parallel metrology;

identify a plurality of candidate acquisition configurations based on the parallel sensor description and the potential metrology locations, each candidate acquisition configuration describing a particular position of the sensor description with respect to the substrate and therefore a corresponding one or more of the potential metrology locations;

evaluate at least some of the candidate acquisition configurations in terms of an evaluation metric;

select a candidate acquisition configuration, based on the evaluation; and define the sampling scheme as that comprising the corresponding metrology locations for each selected acquisition configuration.

* * * * *